(12) United States Patent
Pan et al.

(10) Patent No.: US 8,885,846 B2
(45) Date of Patent: Nov. 11, 2014

(54) ELECTRONIC DEVICE

(71) Applicants: Hung-Sung Pan, Taipei (TW); Ying-Chi Chou, Taipei (TW); Chih-Wei Lu, Taipei (TW); Chun-Liang Wu, Taipei (TW); Long-Cheng Chang, Taipei (TW); Po-Chin Yu, Taipei (TW); Wei-Chih Hsu, Taipei (TW)

(72) Inventors: Hung-Sung Pan, Taipei (TW); Ying-Chi Chou, Taipei (TW); Chih-Wei Lu, Taipei (TW); Chun-Liang Wu, Taipei (TW); Long-Cheng Chang, Taipei (TW); Po-Chin Yu, Taipei (TW); Wei-Chih Hsu, Taipei (TW)

(73) Assignee: Compal Electronics, Inc., Taipei (TW)

( * ) Notice: Subject to any disclaimer, the term of this patent is extended or adjusted under 35 U.S.C. 154(b) by 0 days.

(21) Appl. No.: 13/746,320

(22) Filed: Jan. 22, 2013

(65) Prior Publication Data

US 2014/0153748 A1 Jun. 5, 2014

(30) Foreign Application Priority Data

Dec. 4, 2012 (TW) ............................... 101145514 A

(51) Int. Cl.
*H04R 25/00* (2006.01)
*G06F 1/16* (2006.01)
*H05K 5/00* (2006.01)
*H05K 5/02* (2006.01)

(52) U.S. Cl.
CPC .................................. *H05K 5/0217* (2013.01)
USPC .......................... 381/87; 381/388; 361/679.26

(58) Field of Classification Search
USPC ............ 381/386, 388, 87; 361/679.26, 679.4, 361/679.23, 679.09
See application file for complete search history.

(56) References Cited

U.S. PATENT DOCUMENTS

| 5,978,211 | A | * | 11/1999 | Hong | 361/679.23 |
|---|---|---|---|---|---|
| 6,411,271 | B1 | * | 6/2002 | Bang et al. | 345/87 |
| 7,014,154 | B2 | * | 3/2006 | Jeong et al. | 248/157 |
| 7,940,522 | B2 | * | 5/2011 | Solomon et al. | 361/679.41 |
| 2004/0190238 | A1 | * | 9/2004 | Hubbard | 361/683 |
| 2012/0188701 | A1 | * | 7/2012 | Lu et al. | 361/679.26 |
| 2012/0300381 | A1 | * | 11/2012 | Hung et al. | 361/679.09 |

FOREIGN PATENT DOCUMENTS

| TW | 427601 | 3/2001 |
|---|---|---|
| TW | 562167 | 11/2003 |
| TW | I311902 | 7/2009 |

* cited by examiner

*Primary Examiner* — Davetta W Goins
*Assistant Examiner* — Phylesha Dabney
(74) *Attorney, Agent, or Firm* — Jianq Chyun IP Office

(57) ABSTRACT

An electronic device suitable for connecting with an expansion assembly is provided. The electronic device includes a main body and an expansion module. The expansion module is pivoted to the main body and suitable for rotating relative to the main body between an operating position and an accommodating position. When the expansion module is located at the operating position, the expansion assembly is suitable for being electrically connected to the expansion module and providing a supporting force to the main body.

7 Claims, 7 Drawing Sheets

ELECTRONIC DEVICE

CROSS-REFERENCE TO RELATED APPLICATION

This application claims the priority benefit of Taiwan application serial no. 101145514, filed on Dec. 4, 2012. The entirety of the above-mentioned patent application is hereby incorporated by reference herein and made a part of this specification.

BACKGROUND

1. Technical Field

The invention relates to an electronic device. Particularly, the invention relates to an electronic device capable of connecting an expansion assembly.

2. Related Art

In today's information explosion era, electronic products are widely used in people's daily life. Along with continuous development of electronic technology, electronic products with humanity and good functionality are also developed. Regarding development and application of personal computers, desktop personal computers (desktop PCs) are first developed, and since the desktop PC is very heavy, it is not easy to be carried around. Therefore, notebook PCs and table PCs that are easy to be carried around are developed.

Input output ports (IO ports) of many tablet PCs are directly exposed, which influences appearances of the tablet PCs, and the exposed IO ports are liable to be contaminated by dusts in the air and oxidized to cause a poor contact. In some of the tablet PCs, a cover is configured to cover the IO port, though the cover has to be first lifted in order to use the IO port, which causes usage inconvenience, and the cover is easy to be damaged due to long-term use. Moreover, since the tablet PC cannot erect on the desk by itself, when a user wants to obliquely erect the tablet PC to facilitate viewing and operating, the user has to hold the tablet PC by hand, which is inconvenient in usage.

SUMMARY

The invention is directed to an electronic device, which is adapted to provide an input output (JO) port function through an expansion assembly, and is capable of erecting through support of the expansion assembly.

The invention provides an electronic device, which is adapted to connect with an expansion assembly. The electronic device includes a main body and an expansion module. The expansion module is pivoted to the main body and is adapted to rotate relative to the main body between an operating position and an accommodating position. When the expansion module is located at the operating position, the expansion assembly is adapted to be electrically connected to the expansion module and provide a supporting force to the main body.

In an embodiment of the invention, the main body has a processing module, the expansion module has an electrical connection portion, and the expansion assembly is adapted to be connected to the electrical connection portion to receive a signal from the processing module.

In an embodiment of the invention, the expansion assembly is a speaker assembly or an input output (IO) port expansion assembly.

In an embodiment of the invention, the main body has a fixing assembly, and the fixing assembly is used to position the expansion module to the operating position or the accommodating position.

In an embodiment of the invention, the main body has an accommodating slot, the expansion module is adapted to enter the accommodating slot to reach the accommodating position, and the expansion module is adapted to move out of the accommodating slot to reach the operating position.

In an embodiment of the invention, the expansion module has a protrusion portion, the main body has a sliding slot, and the protrusion portion is slidably disposed in the sliding slot, and when the expansion module rotates relative to the main body, the protrusion portion moves along the sliding slot.

In an embodiment of the invention, the electronic device further includes a pivot member, where a first end of the pivot member is pivoted to the main body, and a second end of the pivot member is pivoted to the expansion module.

In an embodiment of the invention, the main body has a fixing assembly, the fixing assembly includes an elastic portion and a positioning portion. The pivot member has a first positioning recess hole and a second positioning recess hole. When the expansion module is located at the accommodating position, the positioning portion is pushed into the first positioning recess hole through an elastic force of the elastic portion, and when the expansion module is located at the operating position, the positioning portion is pushed into the second positioning recess hole through the elastic force of the elastic portion.

According to the above descriptions, in the electronic device of the invention, the expansion module can be rotated to the operating position relative to the main body for connecting with the expansion assembly, and the electronic device is erected though a supporting force provided by the expansion module, such that a user can view and operate the electronic device via a more comfortable angle. Moreover, when the expansion module has an IO port function, the electronic device itself is unnecessary to be configured with an IO port, by which a design of the electronic device is simplified to avoid a situation that the IO port influences an appearance of the electronic device.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
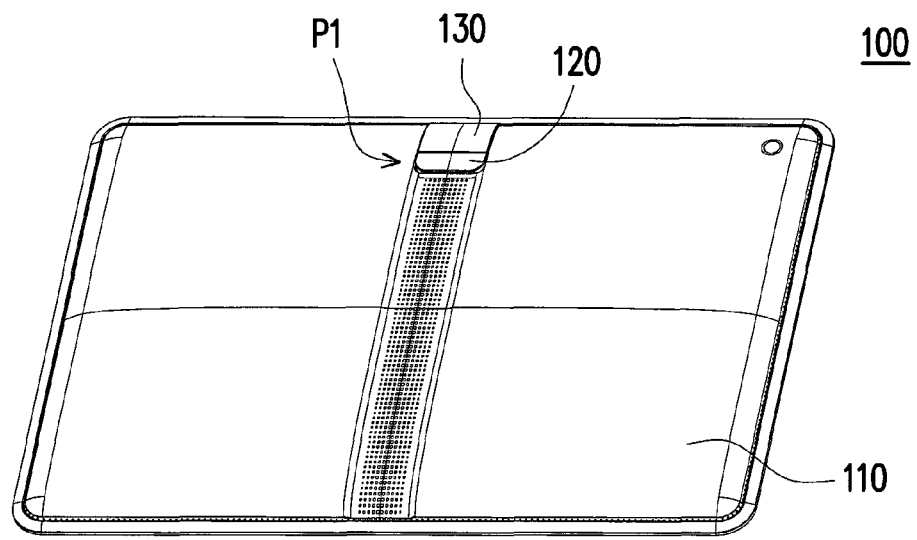
FIG. 1 is a three-dimensional view of an electronic device according to an embodiment of the invention.
Figure 2:
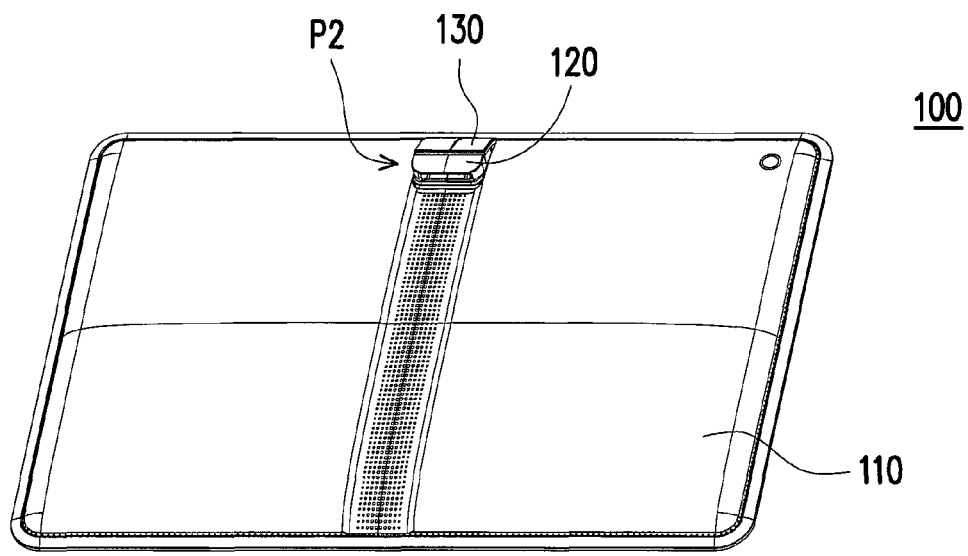
FIG. 2 is a three-dimensional view of an expansion module of FIG. 1 rotated relative to a main body.

FIG. 1 is a three-dimensional view of an electronic device according to an embodiment of the invention. FIG. 2 is a three-dimensional view of an expansion module of FIG. 1 rotated relative to a main body. Referring to FIG. 1 and FIG. 2, the electronic device 100 of the present embodiment is, for example, a tablet personal computer (PC) and includes a main body 110 and an expansion module 120. The expansion module 120 is pivoted to the main body 110 and is adapted to rotate relative to the main body 110 between an accommodating position P1 (shown in FIG. 1) and an operating position (shown in FIG. 2).

Figure 3:
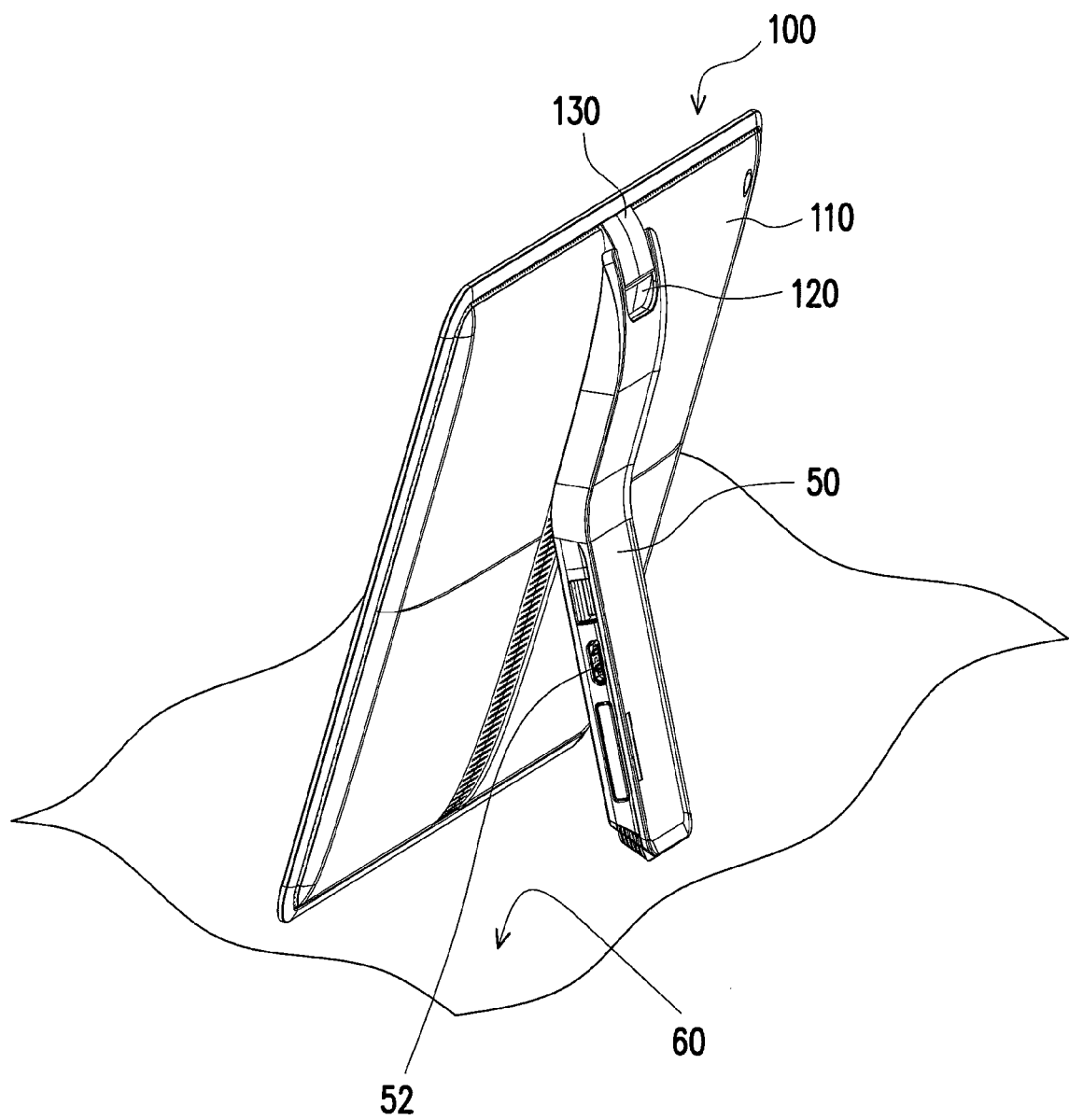
FIG. 3 is a three-dimensional view of the electronic device of FIG. 1 connected to an expansion assembly.

FIG. 3 is a three-dimensional view of the electronic device of FIG. 1 connected to an expansion assembly. Referring to FIG. 3, the electronic device 100 is adapted to connect with an expansion assembly 50. In detail, when the expansion module 120 is located at the operating position P2 as that shown in FIG. 2, the expansion assembly 50 is adapted to be connected to the expansion module 120 as that shown in FIG. 3, and provide a supporting force to the main body 110 to erect the main body 110 on a plane 60, such that a user can operate and view the electronic device 100 via a comfortable angle.

In the present embodiment, the expansion assembly 50 is, for example, an input output (IO) port expansion assembly, and the electronic device 100 may implement data input and output through an IO port 52 on the expansion assembly 50. In this way, the electronic device itself is unnecessary to be configured with an IO port, by which a design of the electronic device 100 is simplified to avoid a situation that the IO port influences an appearance of the electronic device 100. In other embodiments, the expansion assembly 50 can be a speaker assembly or other types of expansion assembly, which is not limited by the invention.

Figure 4:
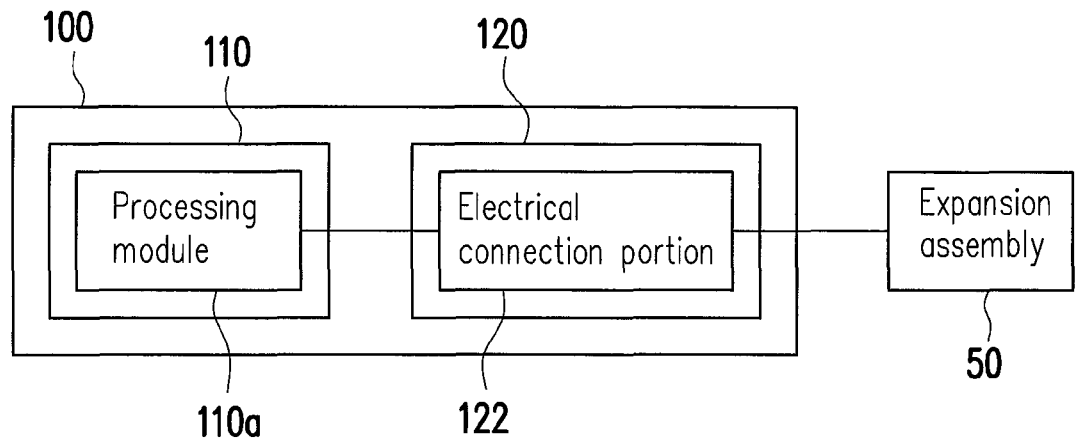
FIG. 4 is a block diagram of the electronic device and the expansion assembly of FIG. 3.

FIG. 4 is a block diagram of the electronic device and the expansion assembly of FIG. 3. Referring to FIG. 4, the main body 110 of the present embodiment has a processing module 110a, and the expansion module 120 has an electrical connection portion 122. The expansion assembly 50 is adapted to be connected to the electrical connection portion 122 to receive signals from the processing module 110a.

Figure 5:
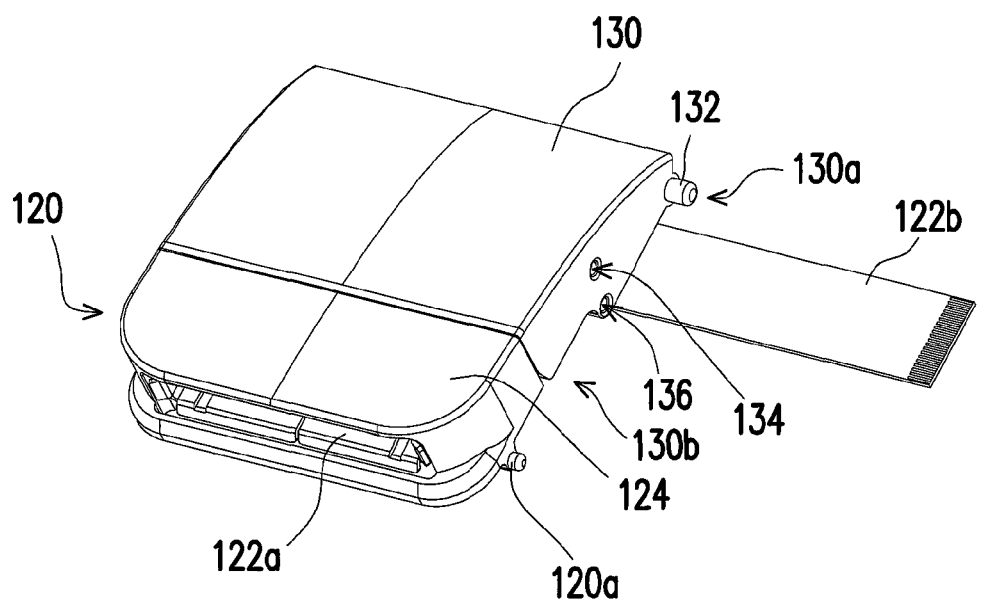
FIG. 5 is a three-dimensional view of the expansion module of FIG. 1.
Figure 6:
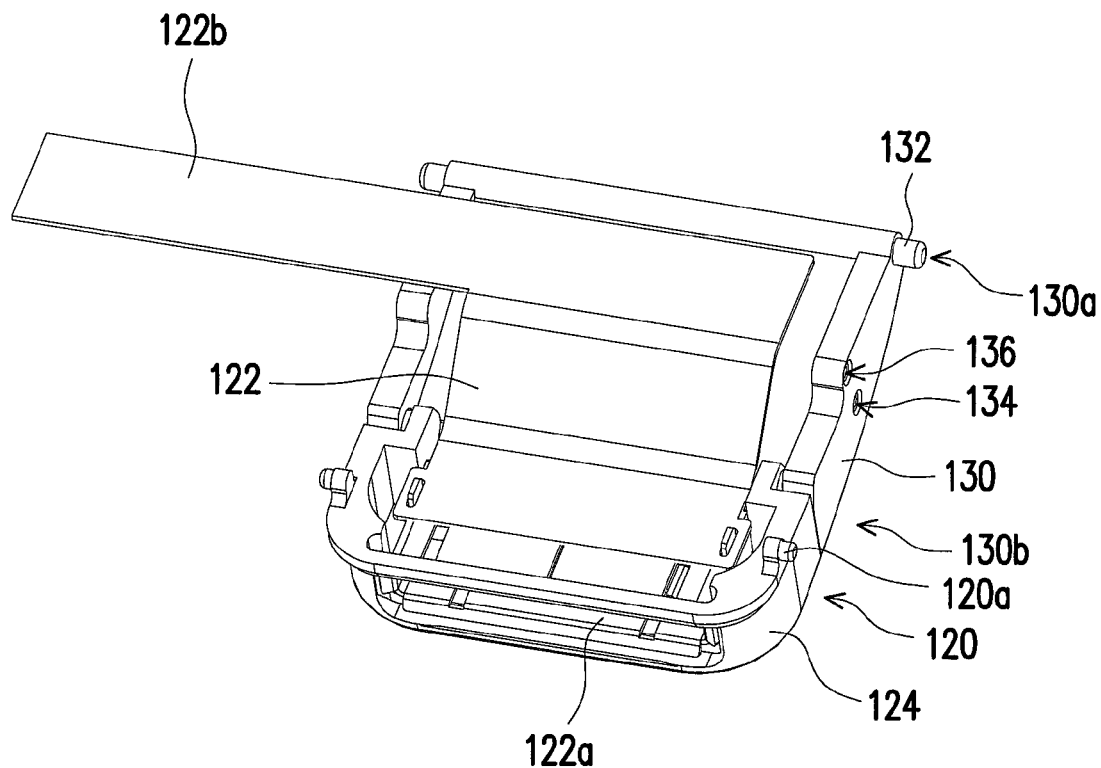
FIG. 6 is a three-dimensional view of the expansion module of FIG. 5 viewing from another viewing angle.
Figure 7:
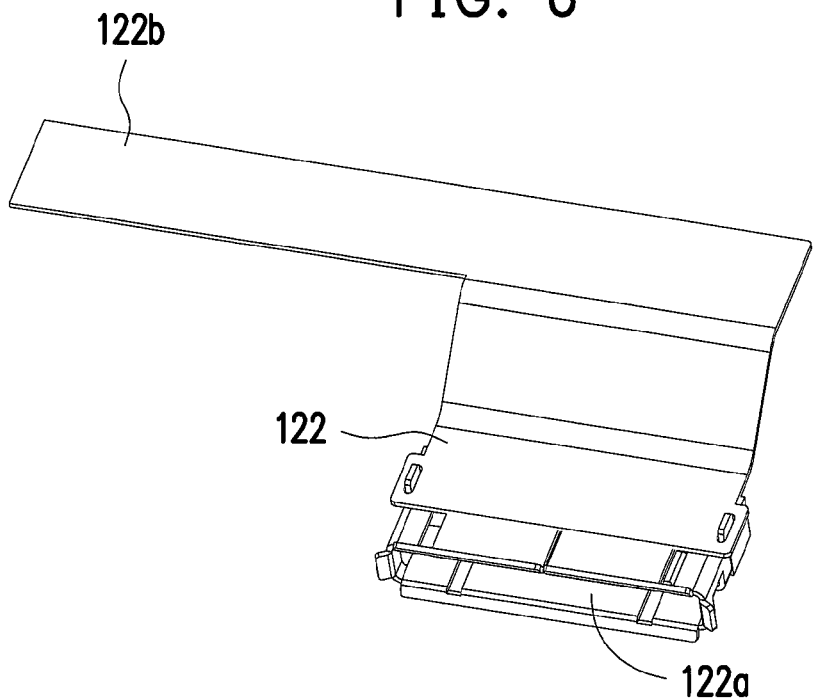
FIG. 7 is a three-dimensional view of the electrical connection portion of FIG. 6.

FIG. 5 is a three-dimensional view of the expansion module of FIG. 1. FIG. 6 is a three-dimensional view of the expansion module of FIG. 5 viewing from another viewing angle. FIG. 7 is a three-dimensional view of the electrical connection portion of FIG. 6. Referring to FIG. 5 to FIG. 7, in detail, the expansion module 120 includes a casing 124, the electrical connection portion 122 is disposed inside the casing 124 and has a slot 122a and a flexible circuit board 122b. The slot 122a is adapted to be inserted by the expansion assembly 50, and the flexible circuit board 122b is electrically connected to the processing module 110a of the main body 110. The processing module 110a is, for example, disposed on a motherboard in the electronic device 100.

Referring to FIG. 5 and FIG. 6, the electronic device 100 of the present embodiment further includes a pivot member 130, where a first end 130a of the pivot member 130 has at least one pivot portion 132, and a second end 130b of the pivot member 130 is pivoted to the expansion module 120. The pivot member 130 further has at least one first positioning recess hole 134 and at least one second positioning recess hole 136, and the expansion module 120 has at least one protrusion portion 120a.

Figure 8:
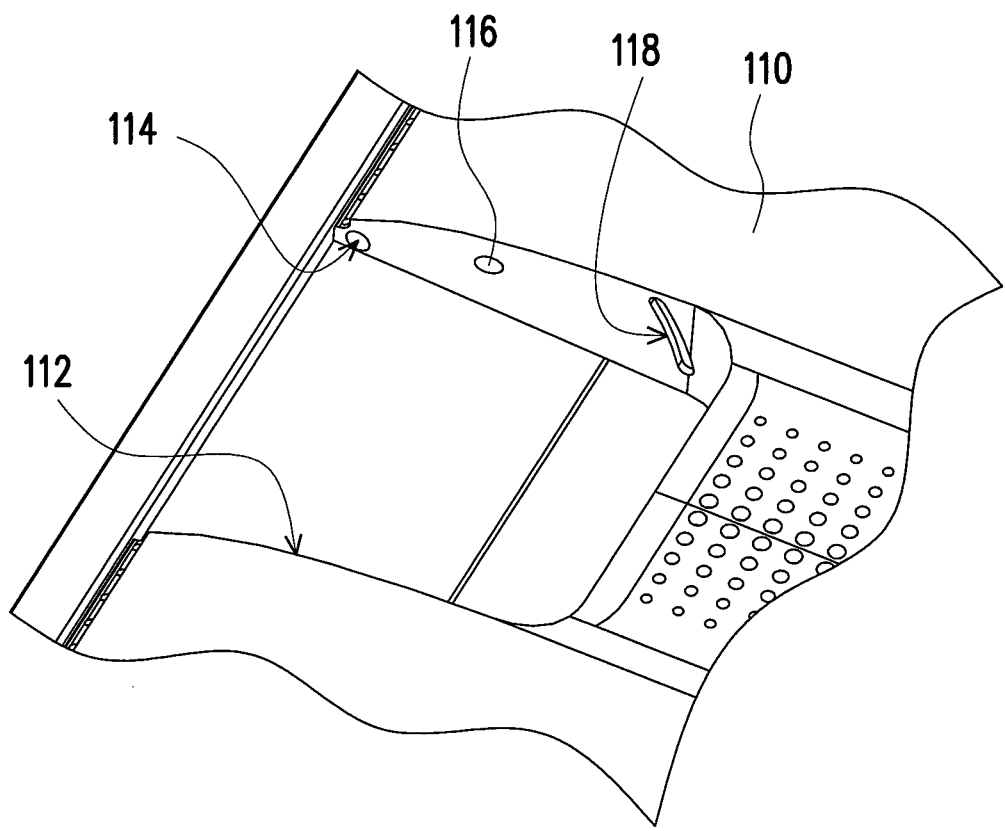
FIG. 8 is a partial three-dimensional view of the main body of FIG. 1.

FIG. 8 is a partial three-dimensional view of the main body of FIG. 1. Referring to FIG. 8, the main body 110 of the present embodiment has an accommodating slot 112, a pivot hole 114, a fixing assembly and a sliding slot 118. The accommodating slot 112 is used to accommodate the expansion module 120 and the pivot member 130 shown in FIG. 5 and FIG. 6, the protrusion portion 120a shown in FIG. 5 and FIG. 6 is slidably disposed in the sliding slot 118, and the first positioning recess hole 134 and the second positioning recess hole 136 shown in FIG. 5 and FIG. 6 are used to interfere with the fixing assembly 116 to position the expansion module 120. Moreover, the pivot hole 114 is used to pivot to the pivot portion 132 shown in FIG. 5 and FIG. 6, so as to pivot the pivot member 130 between the expansion module 120 and the main body 110. In other words, the expansion module 120 of the present embodiment is pivoted to the main body 110 through the pivot member 130. However, in other embodiments, the expansion module 120 can be pivoted to the main body 110 through other suitable manners, which is not limited by the invention.

Figure 9A:
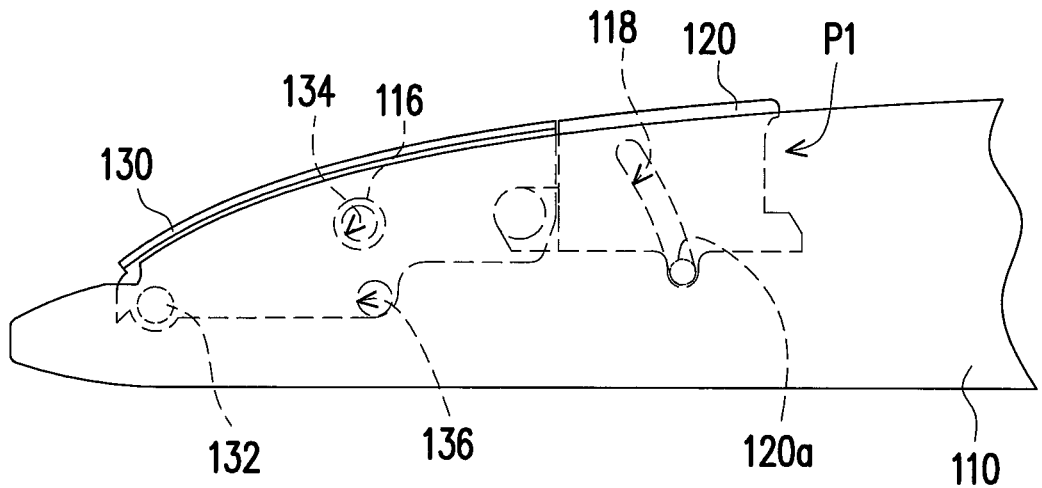
FIG. 9A and FIG. 9B are operation schematic diagrams of the expansion module of FIG. 1.
Figure 9B:
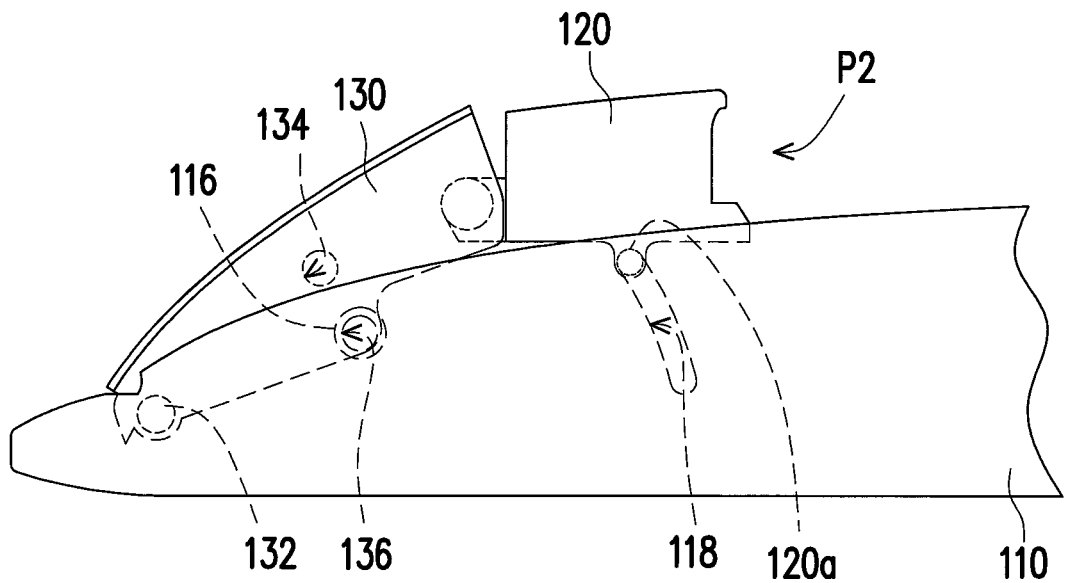

FIG. 9A and FIG. 9B are operation schematic diagrams of the expansion module of FIG. 1. In detail, the expansion module 120 is adapted to enter the accommodating slot 112 to reach the accommodating position P1 shown in FIG. 1 and FIG. 9A, and now the fixing assembly 116 is interfered with the first positioning recess hole 134 to position the expansion module 120 to the accommodating position P1. The expansion module 120 is adapted to rotate relative to the main body 110 and move out of the accommodating slot 112 to reach the operating position P2 shown in FIG. 2 and FIG. 9B, and now the fixing assembly 116 is interfered with the second positioning recess hole 136 to position the expansion module 120 to the operating position P2. During the process that the expansion module 120 rotates relative to the main body 110, the protrusion portion 120a moves along the sliding slot 118 to guild a movement of the expansion module 120 and limit a moving range of the expansion module 120.

Figure 10A:
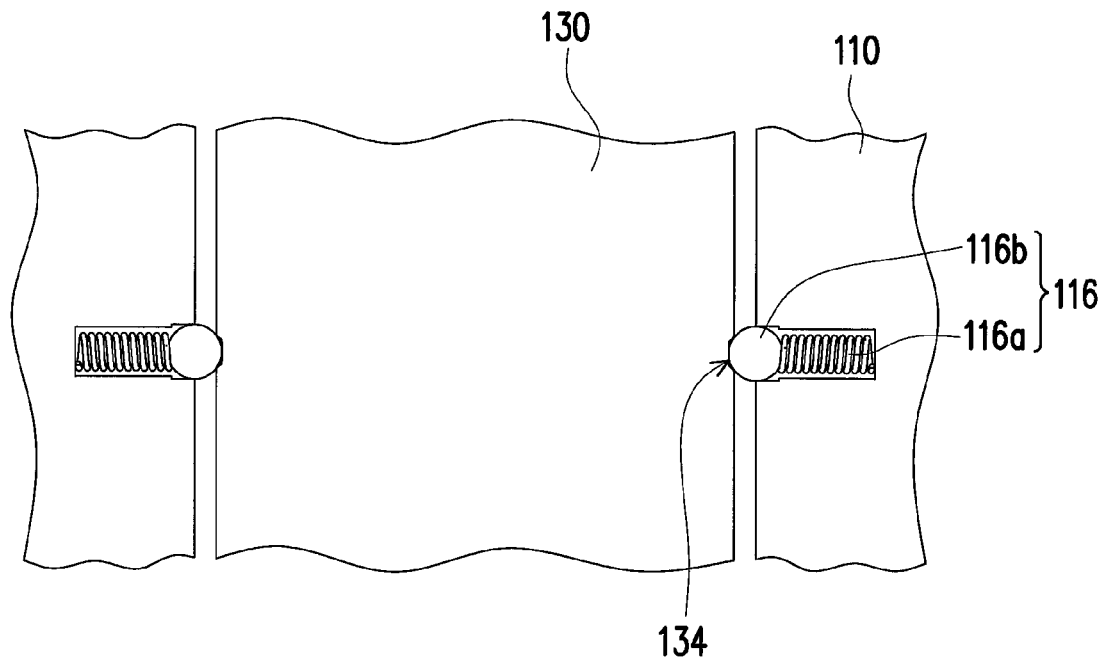
FIG. 10A is a schematic diagram of a first positioning recess hole of FIG. 9A interfered with a fixing assembly.
Figure 10B:
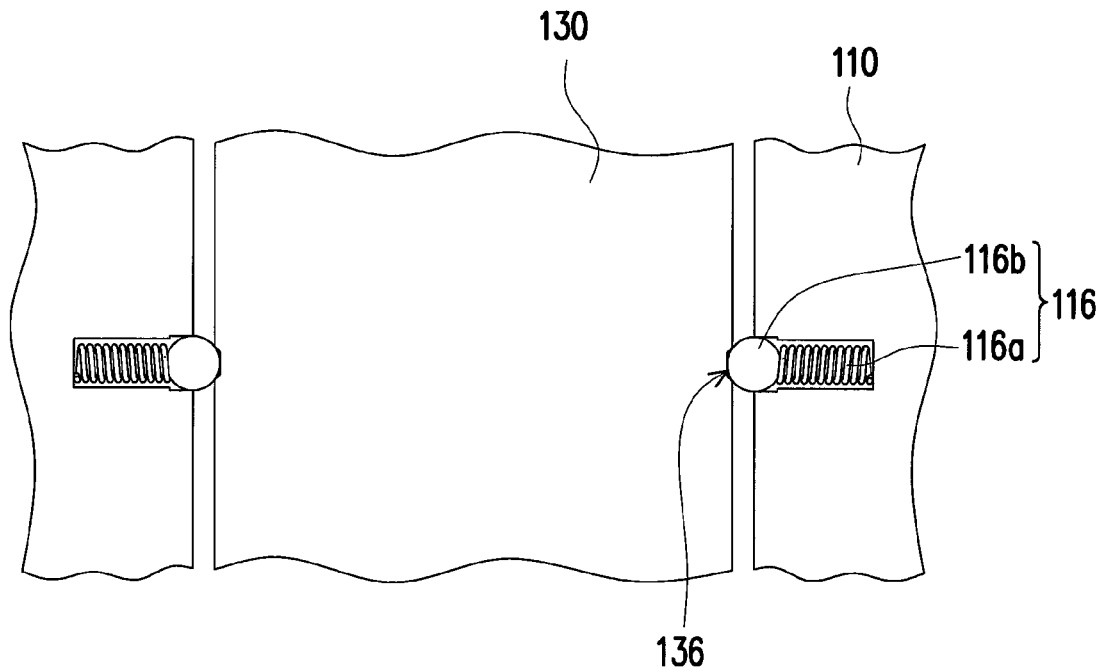
FIG. 10B is a schematic diagram of a second positioning recess hole of FIG. 9B interfered with a fixing assembly.

FIG. 10A is a schematic diagram of the first positioning recess hole of FIG. 9A interfered with the fixing assembly. FIG. 10B is a schematic diagram of the second positioning recess hole of FIG. 9B interfered with the fixing assembly. Referring to FIG. 10A and FIG. 10B, the numbers of the fixing assembly 116, the first positioning recess hole 134 and the second positioning recess hole 136 of the present embodiment are all two. Each of the fixing assembly 116 includes an elastic portion 116a and a positioning portion 116b, the elastic portion 116a is, for example, a spring and the positioning portion 116b is, for example, a steel ball. When the expansion module 120 is located at the accommodating position P1 as that shown in FIG. 9A, the positioning portion 116b is pushed into the first positioning recess hole 134 through an elastic force of the elastic portion 116a as that shown in FIG. 10A, so as to position the pivot member 130 and the expansion module 120. When the expansion module 120 is located at the operating position P2 as that shown in FIG. 9B, the positioning portion 116b is pushed into the second positioning recess hole 136 through the elastic force of the elastic portion 116a as that shown in FIG. 10B, so as to position the pivot member 130 and the expansion module 120.

In summary, in the electronic device of the invention, the expansion module can be rotated to the operating position relative to the main body for connecting with the expansion assembly, and the electronic device is erected though a supporting force provided by the expansion module, such that a user can view and operate the electronic device via a more comfortable angle. Moreover, when the expansion module has an IO port function, the electronic device itself is unnecessary to be configured with an IO port, by which a design of the electronic device is simplified to avoid a situation that the IO port influences an appearance of the electronic device. Moreover, the expansion assembly can also be a speaker or other suitable type of expansion device, and the electronic device may have diversified functions by connecting the expansion assembly.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An electronic device, adapted to connect with an expansion assembly, the electronic device comprising:
    a main body; and
    an expansion module, pivoted to the main body and adapted to rotate relative to the main body between an operating position and an accommodating position, wherein when the expansion module is located at the operating position, the expansion assembly is adapted to be electrically connected to the expansion module and provide a supporting force to the main body, wherein the main body has an accommodating slot, the expansion module is adapted to enter the accommodating slot to reach the accommodating position, and the expansion module is adapted to move out of the accommodating slot to reach the operating position.

2. The electronic device as claimed in claim 1, wherein the main body has a processing module, the expansion module has an electrical connection portion, and the expansion assembly is adapted to be connected to the electrical connection portion to receive a signal from the processing module.

3. The electronic device as claimed in claim 1, wherein the expansion assembly is a speaker assembly or an input output (IO) port expansion assembly.

4. The electronic device as claimed in claim 1, wherein the main body has a fixing assembly, and the fixing assembly is used to position the expansion module to the operating position or the accommodating position.

5. The electronic device as claimed in claim 1, wherein the expansion module has a protrusion portion, the main body has a sliding slot, the protrusion portion is slidably disposed in the sliding slot, and when the expansion module rotates relative to the main body, the protrusion portion moves along the sliding slot.

6. The electronic device as claimed in claim 1, further comprising a pivot member, wherein a first end of the pivot member is pivoted to the main body, and a second end of the pivot member is pivoted to the expansion module.

7. The electronic device as claimed in claim 6, wherein the main body has a fixing assembly, the fixing assembly comprises an elastic portion and a positioning portion, the pivot member has a first positioning recess hole and a second positioning recess hole, when the expansion module is located at the accommodating position, the positioning portion is pushed into the first positioning recess hole through an elastic force of the elastic portion, and when the expansion module is located at the operating position, the positioning portion is pushed into the second positioning recess hole through the elastic force of the elastic portion.

* * * * *